(12) United States Patent
Burke

(10) Patent No.: US 6,458,710 B1
(45) Date of Patent: Oct. 1, 2002

(54) PROCESS FOR FORMING UNIFORM MULTIPLE CONTACT HOLES

(75) Inventor: Hugo Robert Gerard Burke, Canton Carcliff (GB)

(73) Assignee: ESM Limited, South Wales (GB)

( * ) Notice: Subject to any disclaimer, the term of this patent is extended or adjusted under 35 U.S.C. 154(b) by 0 days.

(21) Appl. No.: 09/828,610

(22) Filed: Apr. 9, 2001

(51) Int. Cl.⁷ ............................................. H01L 21/00
(52) U.S. Cl. ........................ 438/713; 216/67; 216/79; 216/99; 216/100; 438/723; 438/743; 438/745; 438/754; 438/756
(58) Field of Search ................................ 438/713, 723, 438/743, 745, 754, 756; 216/67, 75, 79, 99, 100

(56) References Cited

U.S. PATENT DOCUMENTS

| | | | |
|---|---|---|---|
| 4,698,128 A | 10/1987 | Berglund et al. | 156/643 |
| 4,939,105 A | 7/1990 | Langley | 437/228 |
| 5,219,791 A | 6/1993 | Freiberger | 437/195 |
| 5,371,042 A | 12/1994 | Ong | 437/194 |
| 5,629,237 A | 5/1997 | Wang et al. | 438/701 |
| 5,795,793 A | 8/1998 | Kinzer | 437/41 DM |
| 5,877,092 A * | 3/1999 | Lee et al. | 438/734 X |
| 5,912,185 A * | 6/1999 | Kwon | 438/734 X |
| 6,025,273 A | 2/2000 | Chen et al. | 438/706 |

* cited by examiner

*Primary Examiner*—William A. Powell
(74) *Attorney, Agent, or Firm*—Ostrolenk, Faber, Gerb & Soffen, LLP

(57) ABSTRACT

A process for defining uniform contact hole openings in an insulator layer, and in a top portion of a conductive layer, has been developed. The process features a series of isotropic and anisotropic, dry etch procedures, used to define an initial contact hole opening in the insulator layer, and in the top portion of the conductive region. The isotropic dry etch procedure results in a tapered contact hole profile for top portion of the initial contact hole opening, while subsequent anisotropic dry etch procedures create a straight walled contact hole profile for the bottom portion of the initial contact hole opening. After removal of the contact hole defining, photoresist shape, a wet etch procedure is used to laterally recess-the insulator layer exposed in the initial contact hole opening creating the final, uniform contact hole opening.

23 Claims, 3 Drawing Sheets

PROCESS FOR FORMING UNIFORM MULTIPLE CONTACT HOLES

BACKGROUND OF THE INVENTION

(1) Field of the Invention

The present invention relates to methods used to fabricate semiconductor devices and more specifically to a method used to form uniform contact holes in insulator and in semiconductor materials.

(2) Description of Prior Art

Micro-miniaturization, or the ability to fabricate semiconductor devices using sub-micron features, has allowed increased device density, increased device performance, and a reduction of processing costs, to be realized. The smaller device features, achieved via micro-miniaturization, has allowed performance degrading, parasitic capacitances to be reduced, while a greater number of smaller semiconductor chips, still possessing equal or increased device densities when compared to counterpart, larger semiconductor chips, have resulted in decreased processing costs for an individual smaller chip. The advent of micro-miniaturization has in part been accomplished via advances in specific semiconductor disciplines such as photolithography and dry etching. The use of more sophisticated exposure cameras, as well as the development of more sensitive photoresist materials, have allowed the sub-micron images to be routinely defined in the sensitive photoresist layers. In addition the development of advanced dry etching tools and processes have allowed the sub-micron images in overlying, masking photoresist shapes to be successfully transferred to underlying materials, such as insulator and conductive layers, used for the fabrication of the semiconductor devices.

The ability to define sub-micron features in insulator or conductive layers via dry etching procedures, using an overlying photoresist shape as an etch mask, is dependent on the selectivity of the dry etching procedure. For example when defining an opening in an insulator layer, using an overlying photoresist shape as an etch mask, a dry etch chemistry featuring a high etch rate of insulator layer, and a lower etch rate for the masking photoresist shape, is desired. This combination however can result in polymer formation of the sides of the insulator layer, exposed in the contact hole, at various stages of the opening procedure, possibly interfering with the remaining portion of the opening procedure, thus resulting in a non-uniform definition for a specific opening, or non-uniformity between openings. This invention will describe a novel procedure for defining openings in an insulator layer via a combination dry-wet etching procedure, in which the polymer layer, formed during the dry etching component of the procedure, is removed prior to initiation of the wet etch component. This novel procedure allows a partially defined opening to be subjected to a wet etch cycle, after the overlying photoresist shape has been removed, which in turn allows any oxide formed on exposed regions of the opening formed during the photoresist stripping procedure, to also be removed. Prior art, such as Kinzer, in U.S. Pat. No. 5,629,237, describe a dry-wet procedure for defining an opening in an insulator layer, however that prior performs the wet etch component of the opening prior to photoresist and polymer removal, thus not addressing polymer on the sides of the dry etched opening, which can interfere or retard the wet etch cycle.

SUMMARY OF THE INVENTION

It is an object of this invention to define a contact hole opening in an insulator layer, and in a top portion of an underlying semiconductor region.

It is another object of this invention to employ a dry etch-wet etch procedure, to define the contact hole opening.

It is still another object of this invention to remove the defining, masking photoresist shape, and polymer layer, from the sides of the dry etched contact hole, after the dry etching component of the contact hole opening procedure.

It is still yet another object of this invention to perform the wet etch component of the contact hole opening procedure after stripping of the photoresist shape and polymer layer, to allow oxide formed on exposed semiconductor regions of the contact hole opening to be removed, and to improve the uniformity of the contact hole openings.

In accordance with the present invention a method of defining a contact hole opening in a insulator layer, and in a top portion of an underlying semiconductor region, using a combination dry etch-wet etch procedure, is described. An insulator layer is deposited on a semiconductor substrate, to a thickness greater than the desired final thickness, to allow for thinning as a result of a subsequent wet etch procedure. After definition of a masking photoresist shape, a tapered, first portion of the contact hole is defined in a top portion of the insulator layer via an isotropic dry etch procedure. An anisotropic dry etch procedure is then used to define the straight walled, contact hole opening in the remaining portion of insulator layer, and in a top portion of the semiconductor region, also resulting in the formation of a polymer layer on the exposed surfaces of the contact hole. Stripping of the masking photoresist shape, and of the polymer layer, results in oxide growth of the exposed semiconductor surfaces of the contact hole. A wet etch procedure is then employed to remove oxide from the surfaces of the semiconductor region exposed in the contact hole, as well as to controllably recess the exposed insulator surfaces, resulting in uniform contact holes located in the entire semiconductor substrate.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
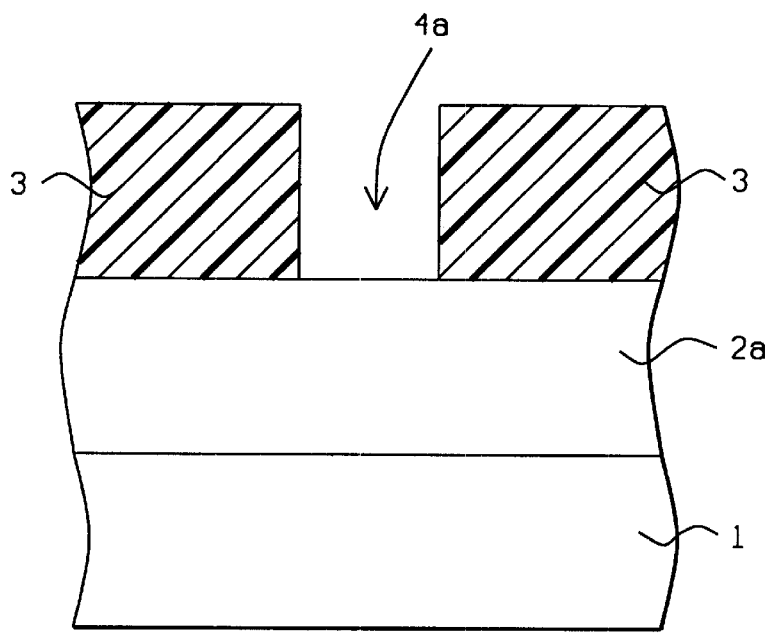
FIGS. 1–6, which schematically, in cross-sectional style, describe the key stages of definition of a contact hole opening, employing a combination dry-wet etch procedure, featuring the wet etch component performed after stripping of the masking photoresist shape and of the polymer layer, which was formed on the exposed surfaces of the contact hole during the dry etching component.

The method of defining a contact hole opening in an insulator layer, and in a top portion of a semiconductor region, employing a combination dry-wet etch procedure, featuring the wet etch component performed after stripping of the masking photoresist shape, and of a polymer layer which was formed on the exposed surfaces of the contact hole during the dry etching component, will now be described in detail. A semiconductor substrate 1, comprised of specific conductive regions, (not shown in the drawings), such as a source/drain region of a metal oxide semiconductor field effect transistor (MOSFET), device, is used and schematically shown in FIG. 1. The conductive region described in this invention can also be a metal interconnect structure. An insulator layer 2a, such as silicon oxide, or boro-phosphosilicate glass (BPSG), is next deposited via low pressure chemical vapour deposition (LPCVD), or via plasma enhanced chemical vapour deposition (PECVD), procedures, to a thickness between about 6000 to 9000 Angstroms. Insulator layer 2a, is intentionally formed 1000 Angstroms thicker than desired to allow for the removal of unprotected insulator layer experienced during a subsequent wet etch component of the contact hole definition procedure, thus resulting in the desired final insulator thickness between of about 5000 to 8000 Angstroms. Photoresist shape 3, is then formed on the top surface of insulator layer 2a, with opening 4a, featuring a diameter between about 5000 to 50000 Angstroms, exposing a portion of the top surface of insulator layer 2a. The result of these procedures are schematically shown in FIG. 1.

Figure 2:
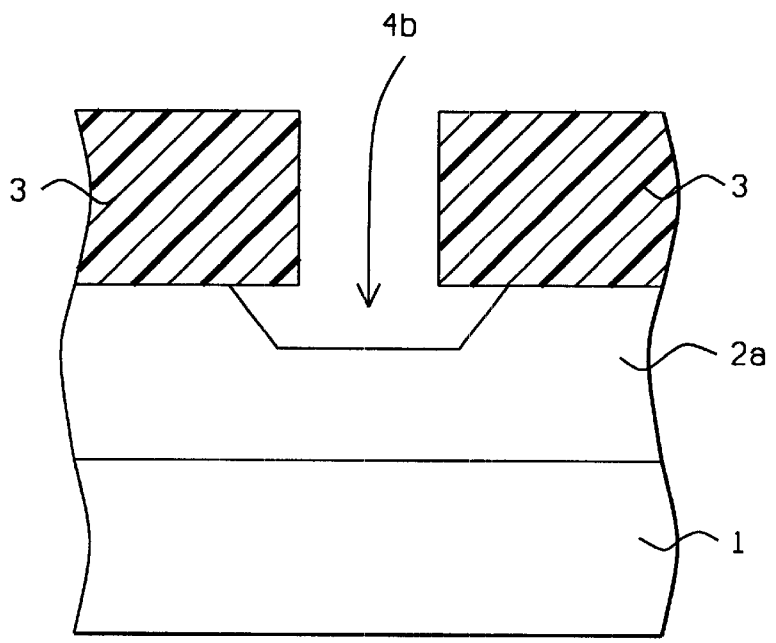

An isotropic, plasma or reactive ion etch (RIE), dry etch procedure, using $NF_3$ as an etchant, at a pressure between about 1000 to 2000 mtorr, is next employed to define tapered contact hole opening 4b, in a top portion of insulator layer 2a. The depth of tapered portion of contact hole opening 4b, is between about 1000 to 3000 Angstroms, in insulator layer 2a. This is schematically shown in FIG. 2. The tapered portion of the contact hole opening will allow improved coverage, or improved conformality, of a subsequent metal structure subsequently formed in contact hole.

Figure 3:
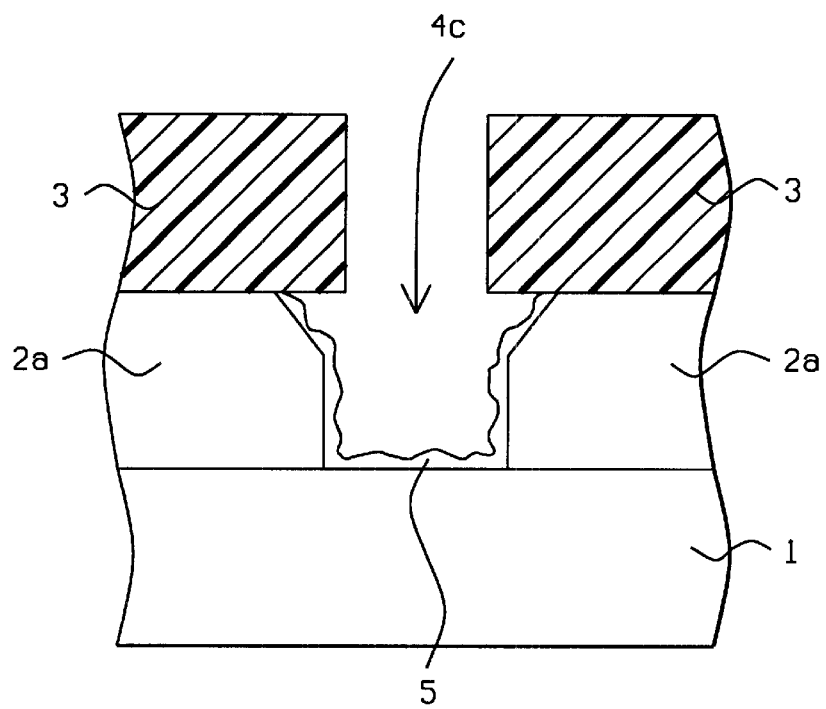

An anisotropic dry etch procedure, such as a reactive ion etch (RIE), is next performed, using $CHF_3$ or $CF_4$ as an etchant, to define the contact opening 4c, in insulator layer 2a, with contact opening 4c, comprised of the tapered opening in the top portion of insulator layer 2a, and comprised of a straight walled opening, formed in the remaining portion of insulator layer, via the use of the anisotropic dry etch procedure. The selective, anisotropic dry etch procedure, performed at a pressure between about 100 to 300 mtorr, resulting in the desired straight walled profile, also results in the undesirable formation of polymer layer 5, on the exposed surfaces of contact hole opening 4c. The diameter of straight walled portion of contact hole opening 4c, is between about 5000 to 50000 Angstroms, identical to the diameter of opening 4a, in photoresist shape 3. This is schematically shown in FIG. 3.

Figure 4:
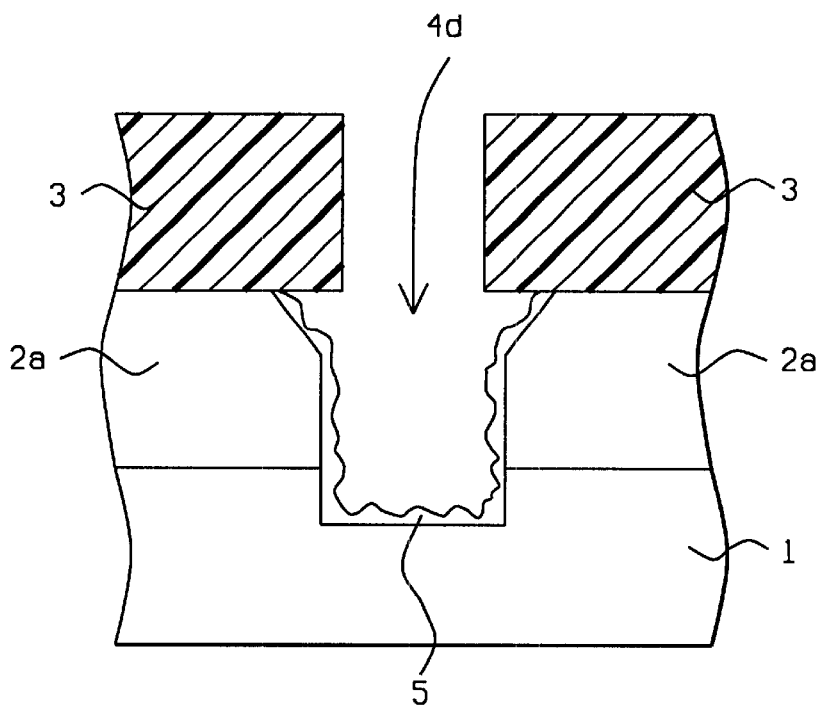

The anisotropic dry etch procedure is continued to allow the contact hole opening to be defined in a top portion of semiconductor region 1, at a depth between about 2000 to 6000 Angstroms. This procedure, performed using $Cl_2$ or $SF_6$ as an etchant, at a pressure between about 100 to 1000 mtorr, will increase the surface area of the semiconductor region now exposed in contact hole opening 4d, allowing decreased contact and interface resistance to be realized when a subsequent metal structure interfaces conductive region of semiconductor substrate 1, in contact hole 4d. Contact hole opening 4d, is now comprised of a tapered component located in a top portion of insulator layer 2a, a straight walled component located in the bottom portion of insulator layer 2a, and a straight walled component located in a top portion of semiconductor substrate 1. This is schematically shown in FIG. 4.

Figure 5:
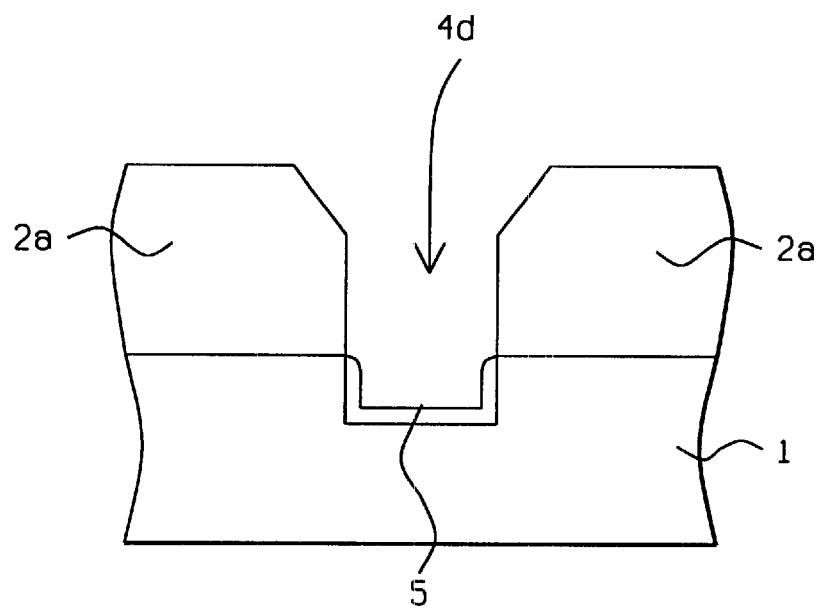
Figure 6:
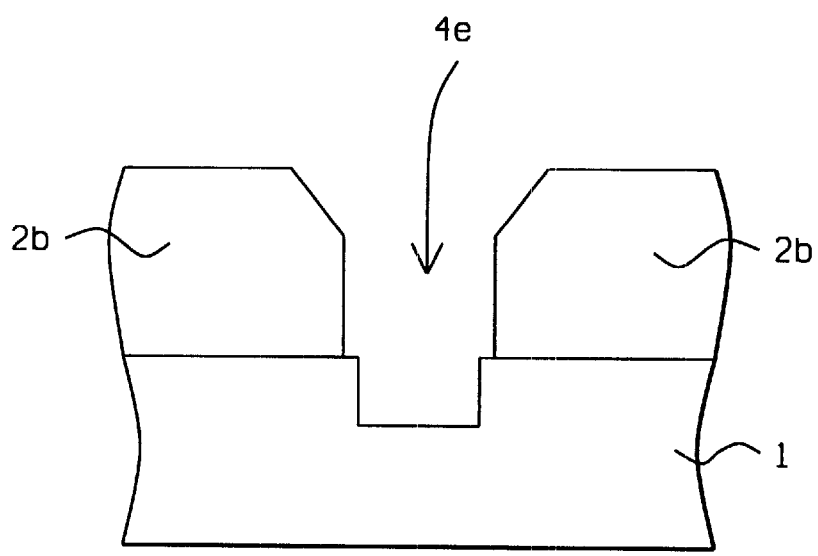

At this stage of the contact hole opening procedure photoresist shape 3, as well as polymer layer 5, are removed via plasma oxygen ashing procedures. The consequence of the plasma oxygen ashing procedure is the formation of thin, silicon oxide layer 6, on the regions of semiconductor substrate 1, exposed in contact hole 4d. This is schematically shown in FIG. 5. A wet etch procedure is next performed, addressing the removal of silicon oxide layer 6, which if left remaining would adversely influence the contact resistance between a subsequent metal structure placed in the contact hole, to the conductive region of semiconductor substrate, as well as addressing the intentional recessing of the portions of insulator layer exposed in the contact hole opening, allowing uniformity of the final contact hole openings to be achieved. A wet etch procedure, using either a buffered hydrofluoric (BHF), acid solution, or using a dilute hydrofluoric (DHF), solution is used remove silicon oxide layer 6, from the exposed surfaces of semiconductor substrate 1, as well as to laterally etch exposed regions of insulator 2a, resulting in contact hole opening 4e, now featuring a diameter between about 5500 to 52000 Angstroms. This is schematically shown in FIG. 6. The controlled lateral recess formed in the sides of contact hole opening 4e, removing between about 500 to 2000 Angstroms of insulator layer from each side of the contact hole opening, allows uniform width, or diameter, contact hole openings to be formed in all regions of the semiconductor substrate. The wet etch procedure also results in the removal of between about 500 to 2000 Angstroms from the top portion of insulator layer 2a, resulting in the thinner insulator layer 2b, now at the desired, or designed thickness of between about 4000 to 8500 Angstroms.

While this invention has been particularly shown and described with reference to, the preferred embodiments thereof, it will be understood by those skilled in the art that various changes in form and details may be made without departing from the spirit and scope of this invention.

What is claimed is:

1. A method of forming a contact hole opening in an insulator layer, and in a top portion of an underlying conductive region, comprising the steps of:

providing a conductive region in, or on, a substrate;

depositing said insulator layer;

forming a photoresist shape on said insulator layer, with an opening in said photoresist shape exposing a portion of a top surface of said insulator layer;

performing a first dry etch procedure, using said photoresist shape as an etch mask, to form a tapered opening in a first portion of said insulator layer;

performing a second dry etch procedure, using said photoresist shape as an etch mask, to form a straight walled opening in a bottom portion of said insulator layer;

performing a third dry etch procedure, using said photoresist shape as an etch mask, to form a straight walled opening in a top portion of said conductive region, resulting in a polymer layer formed on the exposed surfaces of said tapered opening, and on the exposed surfaces of the straight walled openings;

removing said photoresist shape and of said polymer layer, forming an oxide layer on the exposed surfaces of said conductive region; and performing a wet etch procedure to; remove said oxide layer from the top surface of said conductive region, to laterally etch said insulator layer exposed in tapered and straight walled openings, and to remove a portion of the top surface of said insulator layer, resulting in said contact hole opening comprised of a laterally recessed tapered opening in a top portion of a thinned insulator layer, a laterally recessed straight walled opening located in a bottom portion of said thinned insulator layer, and said straight walled opening located in a top portion of said conductive region.

2. The method of claim 1, wherein said conductive region is a source/drain region in a semiconductor substrate.

3. The method of claim 1, wherein said insulator layer is comprised of silicon oxide or of boro-phosphosilicate glass (BPSG), obtained via low pressure chemical vapour deposition (LPCVD), or via plasma enhanced chemical vapour deposition (PECVD) procedures, at a thickness between about 6000 to 9000 Angstroms.

4. The method of claim 1, wherein the diameter of said opening, in said photoresist shape, is between about 5000 to 50000 Angstroms.

5. The method of claim 1, wherein said first dry etch procedure, used to from said tapered opening in said top portion of said insulator layer, is an isotropic dry etch procedure performed at a pressure between about 1000 to 2000 mtorr, using $NF_3$ as an etchant.

6. The method of claim 1, wherein the depth of said tapered opening in said insulator layer, is between about 1000 to 3000 Angstroms.

7. The method of claim 1, wherein said second dry etch procedure, used to form said straight walled opening in said bottom portion of said insulator layer, is an anisotropic RIE procedure, performed at a pressure between about 100 to 300 mtorr, using $CHF_3$ or $CF_4$ as an etchant.

8. The method of claim 1, wherein said third dry etch procedure, used to form said straight walled opening in said top portion of said conductive region, is an anisotropic RIE procedure, performed at a pressure between about 100 to 1000 mtorr, using $Cl_2$ or $SF_6$ as an etchant.

9. The method of claim 1, wherein said photoresist shape, and said polymer layer, are removed via a plasma oxygen ashing procedure.

10. The method of claim 1, wherein between about 500 to 2000 Angstroms of insulator is laterally removed from the sides of said contact hole opening as a result of said wet etching procedure.

11. The method of claim 1, wherein between about 500 to 2000 Angstroms of insulator is removed from the top surface of said insulator layer as a result of said wet etching procedure.

12. The method of claim 1, wherein the diameter of said contact hole opening is between about 5500 to 52000 Angstroms, after said wet etch procedure.

13. A method of forming a uniform contact hole opening in an insulator layer, and in a top portion of a conductive region in a semiconductor substrate, wherein a series of dry etch procedures are used to form an initial contact hole opening, and a subsequent wet etch procedure is employed to define said uniform, contact hole opening, comprising the steps of:

providing said conductive region in said semiconductor substrate;

depositing said insulator layer;

forming a photoresist shape on the top surface of said insulator layer, with an opening in said photoresist layer exposing a portion of the top surface of said insulator layer;

performing an isotropic dry etch procedure, using said photoresist shape as an etch mask, to form a tapered opening in a first portion of said insulator layer;

performing a first anisotropic dry etch procedure, using said photoresist shape as an etch mask, to form a straight walled opening in a bottom portion of said insulator layer;

performing a second anisotropic dry etch procedure, using said photoresist shape as an etch mask, to form a straight walled opening in a top portion of said conductive region, resulting in formation of a polymer layer on the exposed surfaces of said tapered opening, and on the exposed surfaces of the straight walled openings;

performing a plasma oxygen ashing procedure to remove said photoresist shape and said polymer layer, resulting in the formation of an oxide layer on the exposed surfaces of said conductive region; and performing a wet etch procedure in an hydrofluoric acid containing solution, resulting in removal of said oxide layer from the top surface of said conductive region, resulting in lateral recessing of the portions of said insulator layer exposed in tapered and straight walled openings, and resulting in removal of a portion of the top surface of said insulator layer, and creating said uniform contact hole opening comprised of a laterally recessed tapered opening in a top portion of a thinned insulator layer, a laterally recessed straight walled opening located in a bottom portion of said thinned insulator layer, and said straight walled opening located in a top portion of said conductive region.

14. The method of claim 13, wherein said conductive region is a source/drain region in a semiconductor substrate.

15. The method of claim 13, wherein said insulator layer is comprised of silicon oxide or of boro-phosphosilicate glass (BPSG), obtained via low pressure chemical vapour deposition (LPCVD), or via plasma enhanced chemical vapour deposition (PECVD) procedures, at a thickness between about 6000 to 9000 Angstroms.

16. The method of claim 13, wherein the diameter of said opening, in said photoresist shape, is between about 5000 to 50000 Angstroms.

17. The method of claim 13, wherein said isotropic dry etch procedure used to from said tapered opening in said top portion of said insulator layer, is a reactive ion etch (RIE), procedure, performed, at a pressure between about 1000 to 2000 mtorr, using $NF_3$ as an etchant.

18. The method of claim 13, wherein the depth of said tapered opening in said insulator layer, is between about 1000 to 3000 Angstroms.

19. The method of claim 13, wherein said first anisotropic dry etch procedure used to form said straight walled opening in said bottom portion of said insulator layer, is a RIE procedure, performed at a pressure between about 100 to 300 mtorr, using $CHF_3$ or $CF_4$ as an etchant.

20. The method of claim 13, wherein said second anisotropic dry etch procedure used to form said straight walled opening in said top portion of said conductive region, is a RIB procedure, performed at a pressure between about 100 to 1000 mtorr, using $Cl_2$ or $SF_6$ as an etchant.

21. The method of claim 13, wherein between about 500 to 2000 Angstroms of insulator is laterally removed from the sides of said contact hole opening as a result of said wet etching procedure.

22. The method of claim 13, wherein between about 500 to 2000 Angstroms of insulator is removed from the top surface of said insulator layer as a result of said wet, etching procedure.

23. The method of claim 13, wherein the diameter of said uniform contact hole opening is between about 5500 to 52000 Angstroms, after said wet etch procedure.

* * * * *